United States Patent
Sung

(10) Patent No.: US 7,592,940 B2
(45) Date of Patent: Sep. 22, 2009

(54) DIGITAL-TO-ANALOG CONVERTER AND DIGITAL-TO-ANALOG CONVERSION METHOD THEREOF

(75) Inventor: Yoo-Chang Sung, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 0 days.

(21) Appl. No.: 12/003,156

(22) Filed: Dec. 20, 2007

(65) Prior Publication Data

US 2008/0150779 A1   Jun. 26, 2008

(30) Foreign Application Priority Data

Dec. 22, 2006   (KR) .................. 10-2006-0132528

(51) Int. Cl.
   *H03M 1/68* (2006.01)
(52) U.S. Cl. ...................... 341/145; 341/150
(58) Field of Classification Search ................. 341/144, 341/145, 150
   See application file for complete search history.

(56) References Cited

U.S. PATENT DOCUMENTS

| | | | |
|---|---|---|---|
| 6,268,817 B1 * | 7/2001 | Min et al. | 341/145 |
| 7,355,543 B2 * | 4/2008 | Kwon-Chang et al. | 341/150 |
| 7,425,941 B2 * | 9/2008 | Sung et al. | 345/98 |
| 7,453,386 B2 * | 11/2008 | Jeon et al. | 341/145 |
| 2008/0024478 A1 * | 1/2008 | Yoshioka et al. | 345/210 |
| 2008/0309538 A1 * | 12/2008 | Chang et al. | 341/145 |

FOREIGN PATENT DOCUMENTS

| | | |
|---|---|---|
| JP | 10-242860 | 9/1998 |
| JP | 2000-151407 | 5/2000 |
| KR | 2000-0014400 | 3/2000 |
| KR | 2000-0019815 | 4/2000 |

* cited by examiner

*Primary Examiner*—Howard Williams
(74) *Attorney, Agent, or Firm*—Morgan Lewis & Bockius LLP

(57) ABSTRACT

A digital-to-analog converter (DAC) can minimize the increase of an area caused by increase of number of bits. The DAC includes a coarse resistor-string digital-to-analog conversion unit for selectively outputting $2^N$-level analog voltages in response to upper N-bit digital data, wherein N is a natural number greater than or equal to 2, a fine resistor-string digital-to-analog conversion unit for selectively outputting $2^N$-level analog voltages in response to lower N-bit digital data, wherein the $2^N$-level analog voltages is obtained by dividing a level of unit voltage of the coarse resistor-string digital-to-analog conversion unit into $2^N$-levels, and a voltage combining unit for outputting $2^{2N}$-level analog output signals by combining the output of the coarse resistor-string digital-to-analog conversion unit and the output of the fine resistor-string digital-to-analog conversion unit.

5 Claims, 8 Drawing Sheets

US 7,592,940 B2

DIGITAL-TO-ANALOG CONVERTER AND DIGITAL-TO-ANALOG CONVERSION METHOD THEREOF

CROSS-REFERENCE TO RELATED APPLICATIONS

The present invention claims priority of Korean patent application number 10-2006-0132528, filed on Dec. 22, 2006, which is incorporated by reference in its entirety.

BACKGROUND OF THE INVENTION

The present invention relates to a semiconductor device, and more particularly to a digital-to-analog converter (DAC). A DAC is a device that converts a digital signal into an analog signal and is widely used in most electronic applications. A source driver of a thin film transistor-liquid crystal display (TFT-LCD) panel performs a digital-to-analog conversion. Thus, a DAC is essentially used in the source driver and has a great influence on display characteristics.

A conventional 6-bit or 8-bit source driver has used a resistor-string DAC. The resistor-string DAC is widely used in most source drivers because it has a good monotonicity and a good output characteristic.

A gray scale of a TFT-LCD system increases from 8 bits to 10 bits. When a typical resistor-string DAC extends to 10 bits, it still exhibits a good output characteristic, but occupies a very large area. For example, if 2 bits increase in the gray scale of the resistor-string DAC, the area of the DAC increases about four times.

Accordingly, a variety of DACs have been proposed for a source driver of a TFT-LCD having a high gray scale of 10 bits or more. A representative DAC is a charge-redistributed DAC using two capacitors. The charge-redistributed DAC can solve the increase of the area but has a poor output characteristic. Further, the yield of the DAC may decrease because of the use of the capacitors that are sensitive to variations in a manufacturing process.

SUMMARY OF THE INVENTION

Embodiments of the present invention are directed to providing a DAC that can minimize the increase of an area caused by increase of number of bits.

In accordance with an aspect of the present invention, there is provided a digital-to-analog converter including a coarse resistor-string digital-to-analog conversion unit for selectively outputting $2^N$-level analog voltages in response to upper N-bit digital data, wherein N is a natural number greater than or equal to 2, a fine resistor-string digital-to-analog conversion unit for selectively outputting $2^N$-level analog voltages in response to lower N-bit digital data, the $2^N$-level analog voltages being obtained by dividing a level of unit voltage of the coarse resistor-string digital-to-analog conversion unit into $2^N$ levels, and a voltage combining unit for outputting $2^{2N}$-level analog output signals by combining the output of the coarse resistor-string digital-to-analog conversion unit and the output of the fine resistor-string digital-to-analog conversion unit.

In accordance with another aspect of the present invention, there is provided a digital-to-analog conversion method including, selectively outputting $2^N$-level coarse analog voltages in response to upper N-bit digital data, wherein N is a natural number greater than or equal to 2, selectively output $2^N$-level fine analog voltages in response to lower N-bit digital data, the $2^N$-level fine analog voltages being obtained by dividing a level of unit voltage of the coarse analog voltages into $2^N$ levels, and outputting $2^{2N}$-level analog output signals by combining the coarse analog voltages and the fine analog voltages.

DESCRIPTION OF SPECIFIC EMBODIMENTS

In accordance with the present invention, it is provided that resistor-string DACs are stratified and outputs of the resistor-string DACS, i.e., stratified outputs, are combined. For example, in case of 2N bit resistor-string DAC, N bit coarse resistor-string DAC and N bit fine resistor-string DAC are provided to constitute a hierarchy. The fine resistor-string DAC subdivides a voltage corresponding to a unit voltage of the coarse resistor-string DAC. By combining two different unit levels of voltages, i.e., output voltages of coarse and fine resistor-string DACS, output voltages having a variety of levels are generated. Meanwhile, the stratified outputs can be combined in many manners. In an embodiment of the present invention, an output corresponding to 2N bits are provided by capacitive coupling using a capacitor and a unit gain buffer. In accordance with the present invention it can be minimized that the area of DAC increases due to an increase of output bits, because stratified resistor-string DACs are used. In addition, basically a resistor-string DAC can prevent deterioration with respect to output characteristics which may be caused by a charge-redistributed DAC.

Hereinafter, a digital-to-analog converter in accordance with the present invention will be described in detail with reference to the accompanying drawings.

Figure 1:
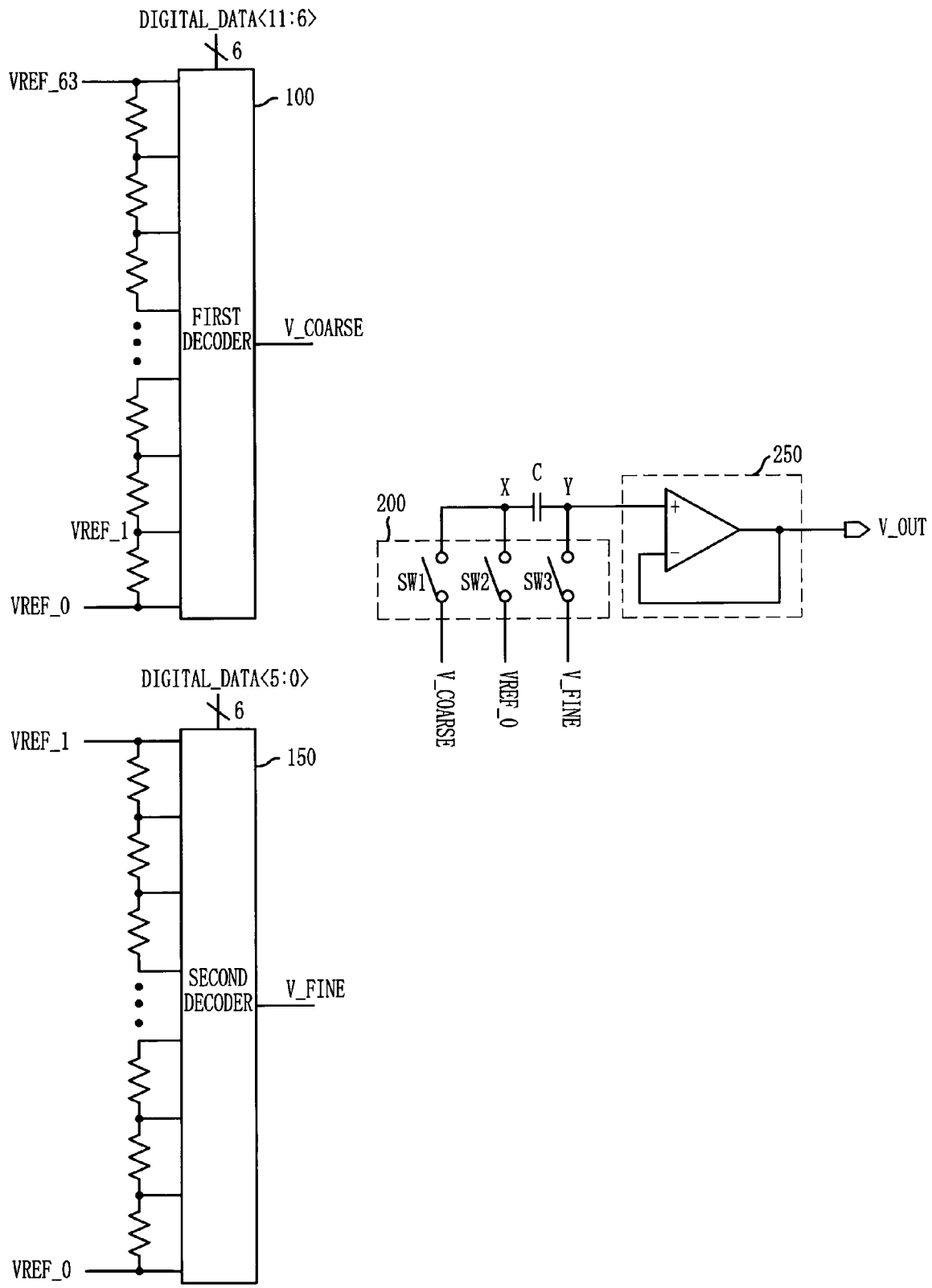
FIG. 1 is a circuit diagram of a 12-bit DAC in accordance with an embodiment of the present invention.

FIG. 1 is a circuit diagram of a 12-bit DAC in accordance with an embodiment of the present invention.

Referring to FIG. 1, the 12-bit DAC includes a coarse resistor-string digital-to-analog conversion unit, a fine resistor-string digital-to-analog conversion unit, and a voltage combining unit. The coarse resistor-string digital-to-analog conversion unit receives upper 6-bit digital data DIGITAL_DATA<11:6> to selectively output $64(=2^6)$-level coarse analog voltages V_COARSE. The fine resistor-string digital-to-analog conversion unit receives lower 6-bit digital data DIGITAL_DATA<5:0> to selectively output $64(=2^6)$-level fine analog voltages V_FINE. The fine analog voltage V_FINE is a voltage obtained by again dividing a level of unit voltage of the coarse resistor-string digital-to-analog conversion unit into 64 levels. The unit voltage corresponds to 1 LSB. The voltage combining unit outputs $4096(=2^{12})$-level analog output signals V_OUT by combining the coarse analog voltages V_COARSE outputted from the coarse resistor-string digital-to-analog conversion unit and the fine analog voltages V_FINE outputted from the fine resistor-string digital-to-analog conversion unit.

The coarse resistor-string digital-to-analog conversion unit includes sixty-four resistors and a first decoder 100. The sixty-four resistors are serially connected between a lowest reference voltage (VREF_0) terminal and a highest reference voltage (VREF_63) terminal and are configured to divide voltage difference between the highest reference voltage VREF_63 and the lowest reference voltage VREF_0 into 64 levels. The first decoder 100 selectively outputs one of voltages that are coarsely divided into 64 levels according to the upper 6-bit digital data DIGITAL_DATA<11:6>. When the sixty-four resistors have the same resistances, the voltages of 64 levels have the constant voltage difference.

The fine resistor-string digital-to-analog conversion unit includes sixty-four resistors and a second decoder 150. The sixty-four resistors are serially connected between the lowest reference voltage (VREF_0) terminal, e.g., a ground terminal, and a unit reference voltage (VREF_1) terminal of the coarse resistor-string digital-to-analog conversion unit and configured to divide the unit reference voltage VREF_1 of the coarse resistor-string digital-to-analog conversion unit into 64 levels. The second decoder 150 selectively outputs one of voltages that are finely divided into 64 levels according to the lower 6-bit digital data DIGITAL_DATA<5:0>. Preferably, the sixty-four resistors have the same resistances.

The voltage combining unit can be implemented in various manners. In the current embodiment of the present invention, the voltage combining unit includes one capacitor C, a switching circuit 200, and a unit gain buffer circuit 250. The switching circuit 200 provides a variety of capacitive coupling by switching the connection of two nodes X and Y of the capacitor C, the coarse analog voltage (V_COARSE) terminal, the lowest reference voltage (VREF_0) terminal, and the fine analog voltage (V_FINE) terminal. The unit gain buffer circuit 250 buffers the voltage of the node Y, which is generated by the capacitive coupling, and outputs the 4096-level analog output signal V_OUT.

The switching circuit 200 includes a switch SW1 disposed between the node X of the capacitor C and the coarse analog voltage (V_COARSE) terminal, a switch SW2 disposed between the node X of the capacitor C and the lowest reference voltage (VREF_0) terminal, and a switch SW3 disposed between the node Y of the capacitor C and the fine analog voltage (V_FINE) terminal. The unit gain buffer circuit 250 has a non-inverting terminal connected to the node Y of the capacitor C and an inverting terminal feedback-connected to an analog output signal (V_OUT) terminal.

Figure 2A:
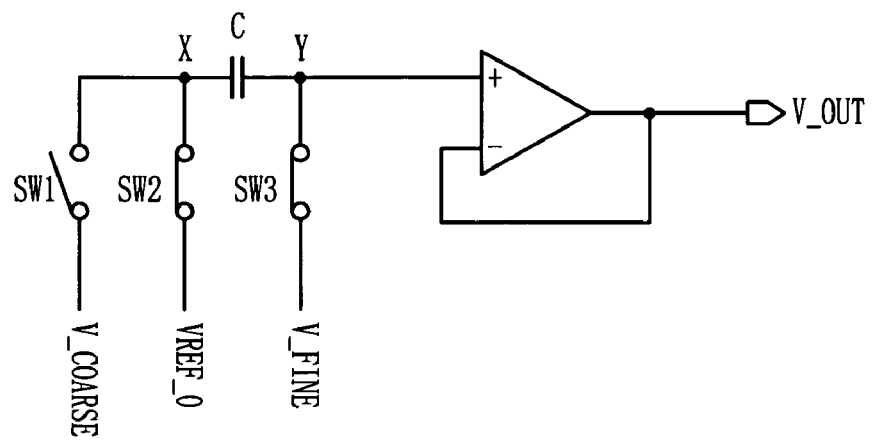
FIGS. 2A and 2B are circuit diagrams illustrating the operation states of the DAC described in FIG. 1
Figure 2B:
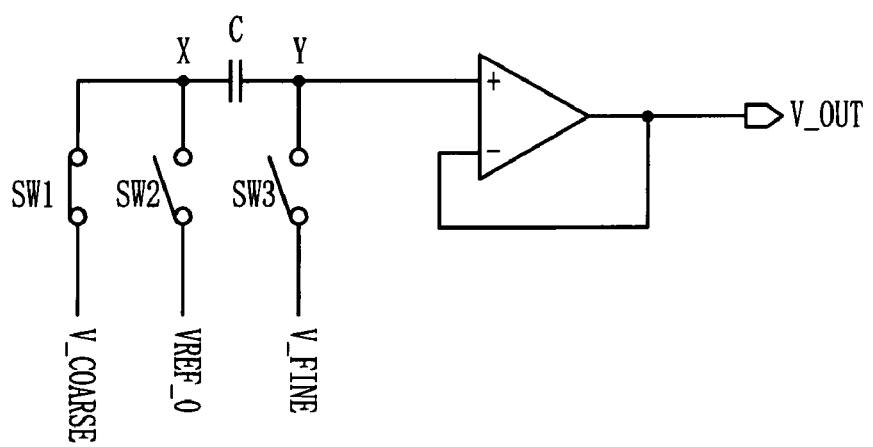

FIGS. 2A and 2B are circuit diagrams illustrating the operation states of the DAC described in FIG. 1.

Referring to FIG. 2A, when the switch SW1 is turned off and the switches SW2 and SW3 are turned on, the fine analog voltage terminal V_FINE is connected and the capacitor C is charged. Simultaneously, the voltage of the node Y is outputted through the unit gain buffer circuit 250. At this point, a voltage corresponding to the fine analog voltage V_FINE is applied to the nodes X and Y of the capacitor C.

Referring to FIG. 2B, when the switches SW2 and SW3 are turned off and the switch SW1 is turned on, the coarse analog voltage (V_COARSE) terminal is connected to the node X of the capacitor C. In this case, the voltage level of the node X of the capacitor C rapidly increases from the ground voltage to the coarse analog voltage V_COARSE, and the voltage level of the node Y of the capacitor C becomes a voltage level corresponding to the sum of the coarse analog voltage V_COARSE and the fine analog voltage V_FINE. The voltage level of the node Y of the capacitor C is amplified with unity gain by the unit gain buffer circuit 250, thereby driving an output terminal.

Consequently, the 12-bit resistor-string DAC is implemented using two 6-bit resistor-string DACS.

Typically, when a ROM type decoder is implemented with a unit gain buffer circuit for buffering an output signal and a capacitor for compensating an offset of the unit gain buffer circuit, an 2N-bit resistor-string DAC requires $2^{2N}$ resistors, $2N \times 2^{2N}$ transistors, one capacitor, one unit gain buffer, and three switches.

On the other hand, the DAC in accordance with the embodiment of the present invention is implemented with $2 \times 2^N$ resistors, $2 \times N \times 2^N$ transistors, one capacitor, one unit gain buffer, and three switches. The number of the transistors and the number of the resistors can be reduced by $2^{N-1}$ and $2N \times 2^N$, respectively. This means that the increase of the area caused by the increase of the bits can be minimized. The DAC in accordance with the embodiment of the present invention can obtain a better output characteristic than the conventional charge-redistribution DAC because it has the output characteristic of the resistor-string DAC.

Figure 3:
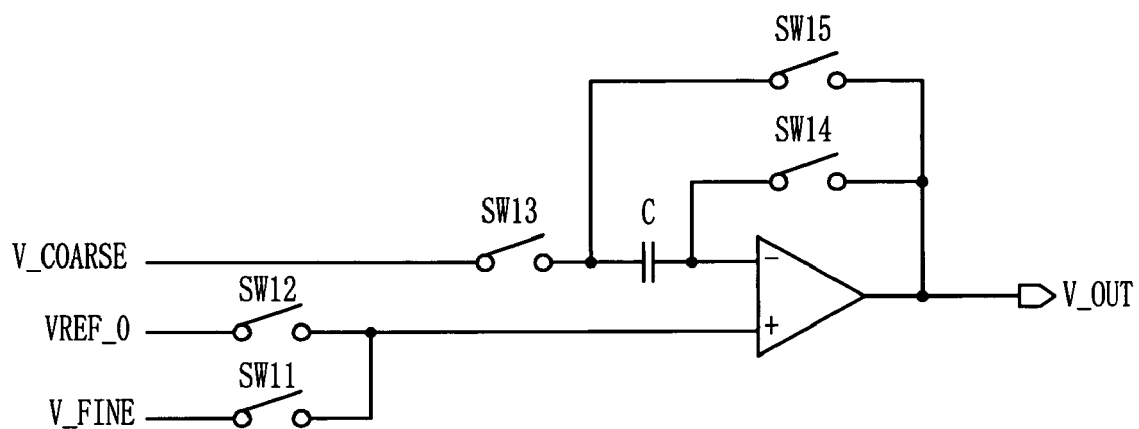
FIG. 3 is a circuit diagram illustrating a voltage combining unit of a DAC in accordance with another embodiment of the present invention.

FIG. 3 is a circuit diagram illustrating a voltage combining unit of the DAC in accordance with another embodiment of the present invention.

The voltage combining unit of FIG. 3 differs from the voltage combining unit of FIG. 1 in that a capacitor C is connected to an inverting terminal of a unit gain buffer circuit and thus the positions and number of switches are changes.

More specifically, a first node of the capacitor C is connected to an inverting terminal of the unit gain buffer circuit, and a switch SW14 is disposed between the first node of the capacitor C and an output terminal. A switch SW13 is disposed between a second node of the capacitor C and a coarse analog voltage (V_COARSE) terminal. A switch SW15 is disposed between the second node of the capacitor C and the output terminal. A switch SW12 is disposed between the non-inverting terminal of the unit gain buffer circuit and the lowest reference voltage (VREF_0) terminal. A switch SW11 is disposed between the non-inverting terminal of the unit gain buffer circuit and the fine analog voltage (V_FINE) terminal.

Figure 4A:
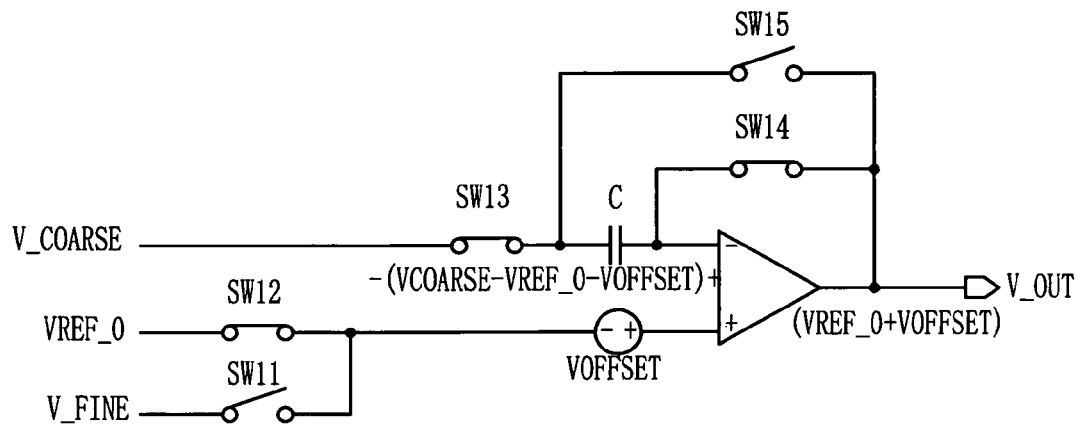
FIGS. 4A to 4C are circuit diagrams illustrating the operation states of the DAC described in FIG. 3.
Figure 4B:
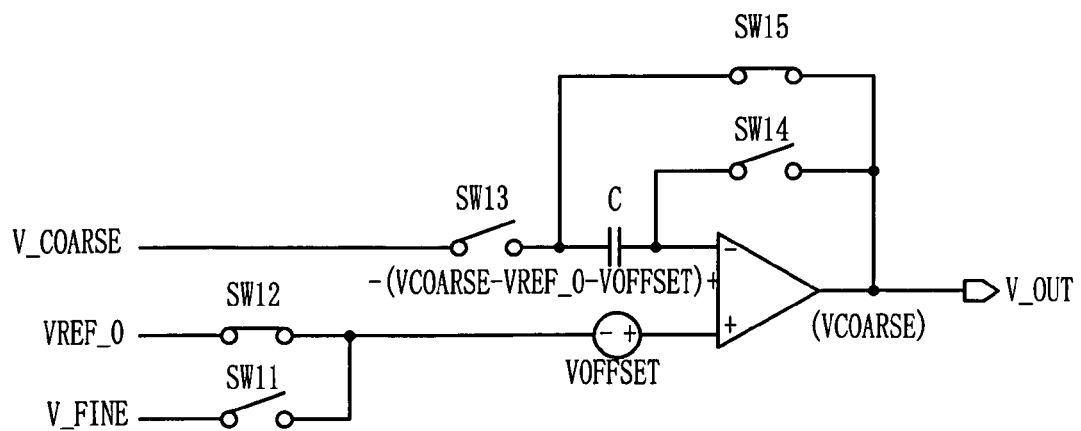
Figure 4C:
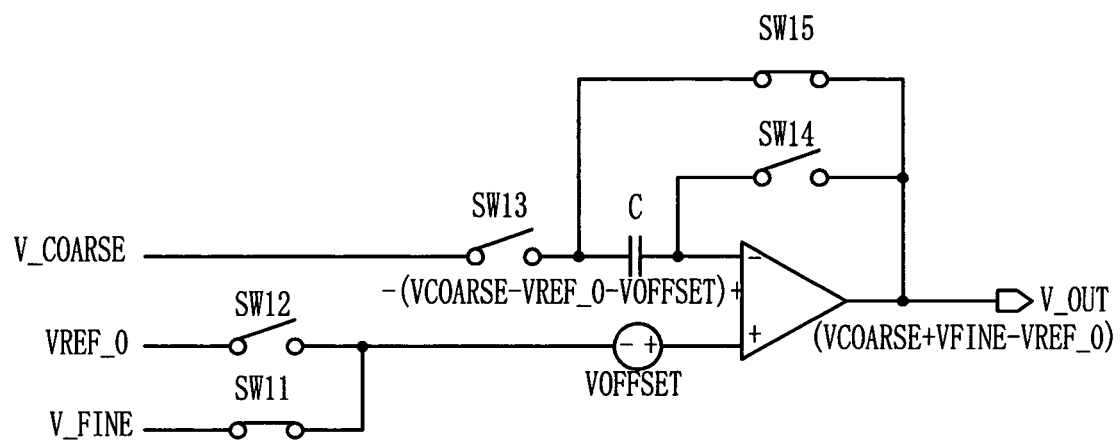

An operation of the DAC in accordance with another embodiment of the present invention will be described below with reference to FIGS. 4A to 4C. FIGS. 4A to 4C are circuit diagrams illustrating the operation states of the DAC described in FIG. 3.

Referring to FIG. 4A, the switches SW12, SW13 and SW14 are turned on, but the switches SW11 and SW15 are turned off. The coarse analog voltage VCOARSE is stored in the capacitor. VOFFSET represents an offset voltage of the unit gain buffer circuit. The voltage source VOFFSET does not exist in the actual circuitry, but it is inserted herein for explaining the operation of the DAC. Assuming that the unit gain buffer has a large gain, the non-inverting terminal and the inverting terminal of the unit gain buffer circuit become a virtual ground. Thus, a voltage of VREF_0+VOFFSET is applied to the output terminal, and a voltage applied across the capacitor C is equal to VCOARSE−VREF_0−VOFFSET.

Referring to FIG. 4B, and then, when the switches SW13 and SW14 are turned off and the switch SW15 is turned on, the coarse analog voltage VCOARSE is outputted at the output terminal of the unit gain buffer circuit and the offset voltage VOFFSET is eliminated.

Referring to FIG. 4C, when the switch SW12 is turned off and the switch SW11 is turned on continuously, the connection of the non-inverting terminal of the unit gain buffer circuit changes from the lowest reference voltage VREF_0 to the fine analog voltage V_FINE. Accordingly, the voltage of VCOARSE+VFINE−VREF_0 which is obtained by adding the fine analog voltage V_FINE to and subtracting the lowest reference voltage VREF_0 from the previous output, i.e., the coarse analog voltage VCOARSE, is outputted at the output terminal of the unit gain buffer circuit.

Figure 5:
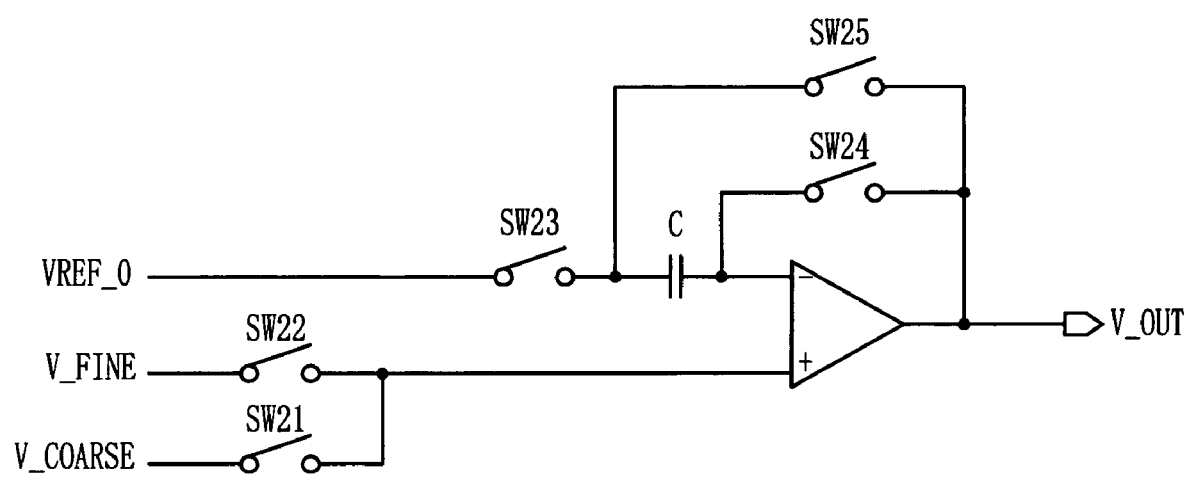
FIG. 5 is a circuit diagram illustrating a voltage combining unit of a DAC in accordance with a further embodiment of the present invention.

FIG. 5 is a circuit diagram illustrating a voltage combining unit of a DAC in accordance with a further embodiment of the present invention.

The voltage combining unit of FIG. 5 differs from the voltage combining unit of FIG. 3 in that the coupling positions of the fine analog voltage (V_FINE) terminal, the coarse analog voltage (V_COARSE) terminal, and the lowest reference voltage (VREF_0) terminal are changed.

In the DACs of FIGS. 1 and 3, the fine analog voltage V_FINE and the coarse analog voltage V_COARSE are summed. In the DAC of FIG. 5, the fine analog voltage V_FINE is subtracted from the coarse analog voltage V_COARSE.

In this embodiment of the present invention, a first node of a capacitor C is connected to an inverting terminal of a unit gain buffer, and a switch SW24 is disposed between the first node of the capacitor C and an output node. A switch SW23 is disposed between a second node of the capacitor C and a lowest reference voltage (VREF_0) terminal. A switch SW25 is disposed between the second node of the capacitor C and the output node. A switch SW22 is disposed between a non-inverting terminal of the unit gain buffer circuit and the fine analog voltage (V_FINE) terminal, and a switch SW21 is disposed between the non-inverting terminal of the unit gain buffer circuit and the coarse analog voltage (V_COARSE) terminal.

Figure 6A:
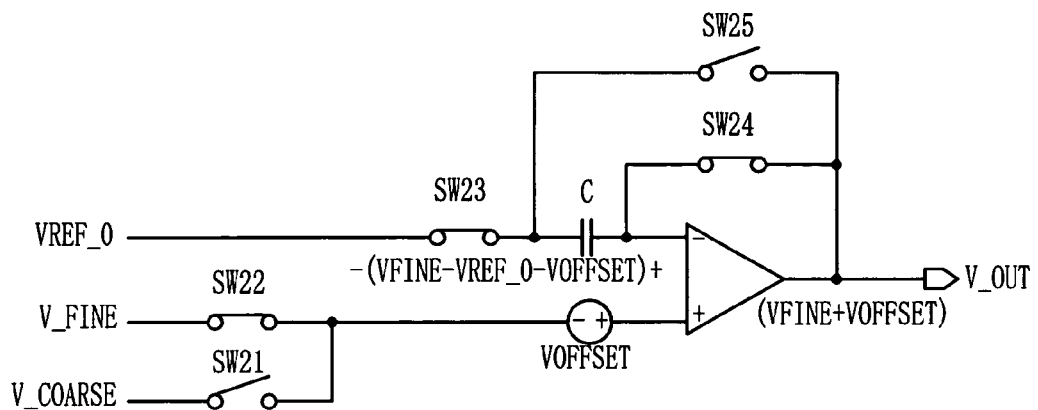
FIGS. 6A to 6C are circuit diagrams illustrating the operation states of the DAC described in FIG. 5.
Figure 6B:
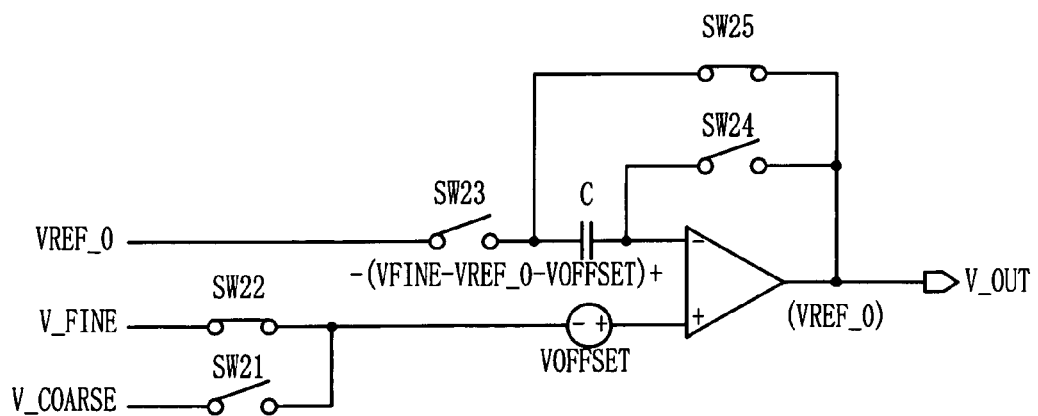
Figure 6C:
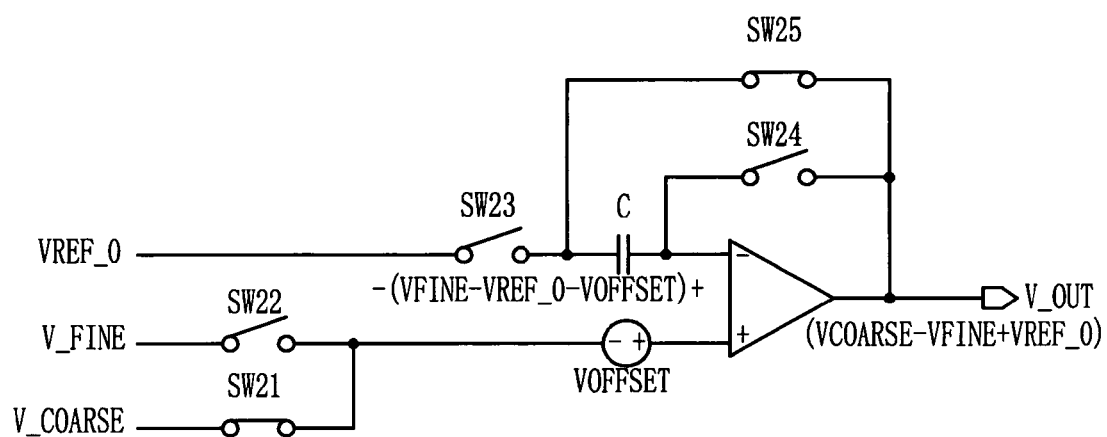

An operation of the DAC in accordance with the further embodiment of the present invention will be described below with reference to FIGS. 6A to 6C. FIGS. 6A to 6C are circuit diagrams illustrating the operation states of the DAC described in FIG. 5.

Referring to FIG. 6A, when the switches SW22, SW23 and SW24 are turned off and the switches SW11 and SW25 are turned on. The fine analog voltage V_FINE is stored in the capacitor C. As describe above, VOFFSET represents an offset voltage of the unit gain buffer circuit. The voltage source VOFFSET does not exist in the actual circuitry, but it is inserted herein for explaining the operation of the DAC. Assuming that the unit gain buffer has a large gain, the non-inverting terminal and the inverting terminal of the unit gain buffer circuit become a virtual ground. Thus, a voltage of VFINE+VOFFSET is applied to the output terminal, and a voltage applied across the capacitor C is equal to VFINE−VREF_0−VOFFSET.

Referring to FIG. 6B, when the switches SW23 and SW24 are turned off and the switch SW25 is turned on thereafter, the lowest reference voltage VREF_0 is outputted at the output terminal of the unit gain buffer circuit and the offset voltage VOFFSET is eliminated.

Referring to FIG. 6C, when the switch SW22 is turned off and the switch SW21 is turned on thereafter, the connection of the non-inverting terminal of the unit gain buffer circuit changes from the fine analog voltage V_FINE to the coarse analog voltage VCOARSE. The voltage of VCOARSE−VFINE+VREF_0 which is obtained by adding the coarse analog voltage VCOARSE to and subtracting the fine analog voltage V_FINE from the previous output, i.e., the lowest reference voltage VREF_0 is outputted at the output terminal of the unit gain buffer circuit.

A difference between the DAC of FIG. 1 and the DACs of FIGS. 3 and 5 is that the DACs of FIGS. 3 and 5 include two more switches. There is no change in number of the resistors and transistors of the decoder. Thus, the increase of the area caused by the increase of the bits can be minimized and a good output characteristic can be obtained.

Although the 12-bit DAC has been described above, the present invention can also be applied to any 4-bit-or-higher DAC, regardless of the number of bits.

Further, although the voltage combining unit of the DAC, which is implemented with one capacitor, one switching unit, and one unit gain buffer circuit, has been described above, it can also be implemented in various manners. For example, the voltage combing unit can be implemented in a way of combining the coarse analog voltage and the fine analog voltage.

As described above, the number of the resistors and transistors of the resistor-string DAC can be significantly reduced, and the increase of the area caused by the increase of bits can be minimized while maintaining the output characteristics of the DAC. Since the area reduction effect of the DAC is exponentially shown as the number of bits increases, it is expected that the source driver of the high-gray-scale TFT-LCD can be developed in short period.

While the present invention has been described with respect to the specific embodiments, it will be apparent to those skilled in the art that various changes and modifications may be made without departing from the spirit and scope of the invention as defined in the following claims.

What is claimed is:

1. A digital-to-analog converter, comprising:
   a coarse resistor-string digital-to-analog conversion unit for selectively outputting one of the $2^N$-level analog voltages in response to upper N-bit digital data, wherein N is a natural number greater than or equal to 2;
   a fine resistor-string digital-to-analog conversion unit for selectively outputting one of the $2^N$-level analog voltages in response to lower N-bit digital data, the $2^N$-level analog voltages being obtained by dividing a level of unit voltage of the coarse resistor-string digital-to-analog conversion unit into $2^N$ levels; and
   a voltage combining unit including:
   a capacitor,
   a switching circuit configured to provide a plurality of capacitive couplings by switching the connection of first and second nodes of the capacitor, a coarse analog voltage terminal of the coarse resistor-string digital-to-analog conversion unit, a lowest reference voltage terminal; and
   a fine analog voltage terminal of the fine resistor-string digital-to-analog conversion unit and a unit gain buffer circuit configured to buffer a voltage generated by the capacitive coupling and output the $2^{2N}$-level analog output signals,
   wherein the unit gain buffer circuit has a positive input terminal connected to the first node of the capacitor and a negative input terminal feedback-connected to an output terminal of the unit gain buffer circuit.

2. The digital-to-analog converter as recited in claim 1, wherein the coarse resistor-string digital-to-analog conversion unit includes:
   $2^N$ resistors serially connected between a lowest reference voltage terminal and a highest reference voltage terminal and configured to divide a highest reference voltage into $2^N$-level coarse division voltages; and a first decoder configured to select one of the $2^N$-level coarse division voltages according to the upper N-bit digital data.

3. The digital-to-analog converter as recited in claim 2, wherein the fine resistor-string digital-to-analog conversion unit includes:
   $2^N$ resistors serially connected between the lowest reference voltage terminal and a unit voltage terminal of the coarse resistor-string digital-to-analog conversion unit and configured to divide the unit voltage into $2^N$-level fine division voltages; and
   a second decoder configured to select one of the $2^N$-level fine division voltages according to the lower N-bit digital data.

4. The digital-to-analog converter as recited in claim 1, wherein the switching circuit includes:
   a first switch disposed between the second node of the capacitor and the coarse analog voltage terminal;
   a second switch disposed between the second node of the capacitor and the lowest reference voltage terminal; and
   a third switch disposed between the first node of the capacitor and the fine analog voltage terminal.

5. A digital-to-analog converter, comprising:
   a coarse resistor-string digital-to-analog conversion unit for selectively outputting one of the $2^N$-level analog voltages in response to upper N-bit digital data, wherein N is a natural number greater than or equal to 2;
   a fine resistor-string digital-to-analog conversion unit for selectively outputting one of the $2^N$-level analog voltages in response to lower N-bit digital data, the $2^N$-level analog voltages being obtained by dividing a level of unit voltage of the coarse resistor-string digital-to-analog conversion unit into $2^N$ levels; and
   a voltage combining unit including a capacitor, a switching circuit configured to provide a plurality of capacitive couplings by switching the connection of first and second nodes of the capacitor, a coarse analog voltage terminal of the coarse resistor-string digital-to-analog conversion unit, the lowest reference voltage terminal, and a fine analog voltage terminal of the fine resistor-string digital-to-analog conversion unit and a unit gain buffer circuit configured to buffer a voltage generated by the capacitive coupling and output the $2^{2N}$-level analog output signals,
   wherein a negative input terminal of the unit gain buffer is connected to the first node of the capacitor and the switching circuit includes a first switch disposed between the first node of the capacitor and an output terminal of the unit gain buffer circuit, a second switch disposed between the second node of the capacitor and the lowest reference voltage terminal, a third switch disposed between the second node of the capacitor and the output terminal of the unit gain buffer circuit, a fourth switch disposed between a positive input terminal of the unit gain buffer circuit and the fine analog voltage terminal and a fifth switch disposed between the positive input terminal of the unit gain buffer circuit and the coarse analog voltage terminal.

* * * * *